United States Patent
Rito et al.

(10) Patent No.: US 11,183,979 B2
(45) Date of Patent: Nov. 23, 2021

(54) GAIN-CONTROL STAGE FOR A VARIABLE GAIN AMPLIFIER

(71) Applicant: IHP GmbH—Innovations for High Performance Microelectronics/Leibniz-Institut fur Innovative Mikroelektronik, Frankfurt (DE)

(72) Inventors: Pedro Rito, Frankfurt (DE); Iria Garcia Lopez, Frankfurt (DE); Minsu Ko, Frankfurt (DE); Dietmar Kissinger, Frankfurt (DE)

(73) Assignee: IHP GMBH—INNOVATIONS FOR HIGH PERFORMANCE MICROELECTRONICS/LEIBNIZ-INSTITUT FÜR INNOVATIVE MIKROELEKTRONIK, Frankfurt (DE)

(*) Notice: Subject to any disclaimer, the term of this patent is extended or adjusted under 35 U.S.C. 154(b) by 1 day.

(21) Appl. No.: 16/718,529

(22) Filed: Dec. 18, 2019

(65) Prior Publication Data

US 2020/0204127 A1 Jun. 25, 2020

(30) Foreign Application Priority Data

Dec. 21, 2018 (EP) .................................. 18215598
Jan. 31, 2019 (EP) .................................. 19154834

(51) Int. Cl.
*H03F 3/45* (2006.01)
*H03G 1/00* (2006.01)

(52) U.S. Cl.
CPC ....... *H03F 3/45089* (2013.01); *H03G 1/0023* (2013.01); *H03G 1/0029* (2013.01)

(58) Field of Classification Search
CPC ............. H03F 3/45089; H03F 3/45183; H03F 2203/45392; H03F 3/45475; H03F 3/45;
(Continued)

(56) References Cited

U.S. PATENT DOCUMENTS 5,994,961 A * 11/1999 Lunn ...................... H03F 1/302
330/254
5,999,053 A 12/1999 Eschauzier
(Continued)

OTHER PUBLICATIONS

Garcia Lopez, Iria et al: 100 GB/s Differential Linear TIAs With Less Than 10 pA/ $\sqrt{\mathrm{Hz}}$ in 130-nm SiGe:C BiCMOS11, IEEE Journal of Solid-State Circuits, IEEE Service Center, Piscataway, NJ, USA, vol. 53, No. 2, Feb. 1, 2018 (Feb. 1, 2018), pp. 458-469.
(Continued)

*Primary Examiner* — Khanh V Nguyen
(74) *Attorney, Agent, or Firm* — Ware, Fressola, Maguire & Barber LLP

(57) ABSTRACT

The invention relates to a gain-control stage (100) for generating gain-control signals ($V_{c+}$, $V_{c-}$) for controlling an external variable-gain amplifying unit (101). The gain-control stage comprises a first (102) and a second differential amplifier unit (112) that receive, at a respective input interface (104,114) a reference voltage signal ($V_{Ref}$) and a variable gain-control voltage signal ($V_{GC}$). The second differential amplifier unit is configured to provide, via a second output interface (120), a control voltage signal ($V_1$) to a controllable first current source (106) of the first differential amplifier unit (102). The first differential amplifier unit (102) is configured to provide, via a first output interface (110), the first and the second gain-control signal ($V_{c+}$, $V_{c-}$) in dependence on the variable gain-control voltage signal ($V_{GC}$), the reference voltage signal ($V_{Ref}$) and
(Continued)

a first biasing current ($I_{B1}$) that depends on the control voltage signal.

12 Claims, 3 Drawing Sheets

(58) Field of Classification Search
CPC .............. H03G 1/0023; H03G 1/0029; H03G 2201/40; H03G 3/3084; H03G 1/0035; H03G 1/04; H03G 1/0088; H03G 3/00; H03G 2201/10
USPC ........................................................ 330/254
See application file for complete search history.

(56) References Cited

U.S. PATENT DOCUMENTS

| | | | | |
|---|---|---|---|---|
| 6,300,832 | B1* | 10/2001 | Okazaki | ............... H03D 7/1433 |
| | | | | 327/359 |
| 6,452,449 | B1* | 9/2002 | Saito | ................... H03F 3/45103 |
| | | | | 327/359 |
| 6,529,077 | B1* | 3/2003 | Dasgupta | ................ H03F 1/306 |
| | | | | 330/254 |
| 2009/0091392 | A1 | 4/2009 | Yang et al. | |

OTHER PUBLICATIONS

European Search Report issued by the EPO dated Sep. 2, 2019 from EP Patent Application No. 19154834.6, 10 pages.

\* cited by examiner

GAIN-CONTROL STAGE FOR A VARIABLE GAIN AMPLIFIER

CROSS REFERENCE TO RELATED APPLICATIONS

This application claims priority under 35 USC § 119 to European Patent Application No. 18215598.6 filed on Dec. 21, 2018 and European Patent Application No. 19154834.6 filed on Jan. 31, 2019, which applications are hereby incorporated by reference in their entirety.

TECHNICAL FIELD

The present invention is directed to a gain-control stage for controlling a gain value of an external variable gain amplifier and to a variable gain amplifier comprising a gain-control stage.

BACKGROUND OF THE INVENTION

Variable gain amplifiers (VGAs) based on current-steering circuits are used in optoelectronic receivers in a RF path. In a RF path, a VGA is commonly used after a transimpedance amplifier (TIA) to amplify a voltage amplitude while offering a possibility to control a gain value. Finally, a buffer stage is used to provide enough power to a load impedance.

U.S. Pat. No. 5,999,053 describes a current steering circuit that includes a first current steering pair of differentially coupled transconductance devices for current steering an input current signal to an output of the current steering circuit. A linearizer circuit includes a second pair of differentially coupled devices coupled electrically in parallel with the first current steering pair so that any current steering which takes place in the second pair is mirrored by the first pair. The linearizer circuit controls the second differential pair so that the current through the devices of the second differential pair that are coupled to the output device of the first current Steering pair is exponentially dependent on the differential input voltage.

The inventors have identified a drawback of current-steering-based VGAs. Variations in a gain-control signal for controlling the gain of the VGA induce changes in an output common-mode voltage, which may impact biasing of a subsequent stage, especially in DC-coupled stages. More importantly, the change in the common-mode voltage may affect the VGA itself by driving operation of certain transistors outside the expected operation mode.

SUMMARY OF THE INVENTION

It is therefore desirable to enable an increase of an operational range of a variable gain amplifier.

In a first aspect of the present invention, a gain-control stage is described. The gain-control stage of the first aspect is suitable for generating a first gain-control signal $V_{c+}$ and a second gain-control signal $V_{c-}$ for controlling a gain value of an external variable-gain amplifying unit. The gain-control stage comprises a first differential amplifier unit and a second differential amplifier unit. The first differential amplifier unit comprises:
  a first input interface configured to receive a reference voltage signal $V_{ref}$ and a variable gain-control voltage signal $V_{GC}$; and
  a first amplifying stage comprising a controllable first current source configured to provide a first biasing current $I_{B1}$ having a first biasing current amount that depends on a current voltage value of a control voltage signal $V_1$. The first amplifying stage is connected to a first polarisation voltage supply line for providing a first polarisation voltage $V_{CC}$ to a second polarisation voltage supply line for providing, via the first current source, a second polarisation voltage as a reference polarisation voltage, and to the first input interface. The first amplifying stage is configured to provide, via a first output interface of the gain-control stage, the first and the second gain-control signals, $V_{C+}$ and $V_{C-}$, in dependence on the variable gain-control voltage signal, the reference voltage signal, and the first biasing current.

The second differential amplifier unit is configured to provide the current voltage value of the control voltage signal, and comprises:
  a second input interface configured to receive the reference voltage signal $V_{ref}$ and the control gain voltage signal $V_{GC}$, and
  a second amplifying stage comprising a second current source configured to provide a second biasing current $I_{B2}$ having a second biasing current amount. The second amplifying stage is also connected to the first polarisation voltage supply line, to the second polarisation voltage supply line via the second current source, and to the second input interface. The second amplifying stage is configured to provide, via a second output interface, the current voltage value of the control voltage signal $V_1$ to the controllable first current source of the first differential amplifier unit.

The second amplifying stage is connected to the first polarisation voltage supply line via an active-load unit. The active-load unit is an electrical unit acting as a circuit component that comprise active devices, such as transistors, and that acts as a current-stable non-linear resistor.

The reference voltage signal $V_{Ref}$ has a predetermined reference voltage value, whereas the variable gain-control voltage signal $V_{GC}$ has a voltage value that is subject to be changed by an external gain-control unit or a user. The first and the second differential amplifier units receive both the reference voltage signal and the gain-control voltage signal as input via the first and the second input interface respectively and are configured to amplify a difference between the reference voltage value and the current, i.e. the actual, voltage value of the variable gain-control voltage signal. The output of the second differential amplifier unit is the control voltage signal, which is a variable signal that depends on difference between the reference voltage value and the current voltage value of the variable gain-control voltage signal.

The control voltage signal generated in the second differential amplifier unit is provided to the first differential amplifier unit and used to control a controllable first current source of the first differential amplifier unit. The first current source is thus configured to provide the first biasing current having a variable first biasing current amount that depends on the current voltage value of the control voltage signal generated and provided by the second differential amplifier unit.

As explained above, the first differential amplifier unit also receives as an input, and via the first input interface, the reference voltage signal and the variable gain-control voltage signal. The second differential amplifier unit is also configured to amplify the difference between reference voltage signal and the current voltage value of the gain control voltage signal. The amplified signal is output via the second output interface, and comprises the first and the second gain-control signals. The values of the first and second gain-control signals thus depend not only on the direct difference between the reference voltage signal and a variable gain-control voltage signal but also on the value of the first biasing current, which in turns depends on the voltage control signal. Thus, the first biasing current is controlled by the second differential amplifier unit.

In the following, embodiments of the gain-control stage of the first aspect will be presented.

In an embodiment, the controllable first current source comprises a first current unit that is configured to receive a first reference current and to provide the respective first biasing current in dependence on the first reference current. The first current unit is preferably, but not necessarily, implemented as a current mirror source or as a Wilson current source.

Alternatively, or additionally, in another embodiment, the second current source comprises a second current unit configured to receive a second reference current and to provide the second biasing current in dependence on the second reference current. The second current unit is preferably, but not necessarily, implemented as a current mirror source or as a Wilson current source. In an embodiment, the second current unit is connected to a passive current source comprising a resistor connected in series to a voltage source.

In an embodiment, that can be combined with any of the technical features described with reference to the previous embodiments, the first amplifying stage comprises a first long-tailed pair circuit. Additionally, or alternatively, in another embodiment, the second amplifying stage comprises a second long-tailed pair circuit with a current mirror load. The current mirror load is therefore the active-load unit of the second differential amplifier unit. In a preferred embodiment, the first long-tailed pair circuit, the second long-tailed par circuit with the current mirror load or the first and the second long-tailed pair circuits and the current mirror load comprise field effect transistors. Preferably, the current mirror load of the second long-tailed circuit comprises two PMOS transistors having the same nominal dimensions, i.e. two matched transistors.

The second output interface is connected to the current mirror load. Advantageously, control voltage signal is fed at a gate connection of a PMOS transistor of the controllable first current source of the first differential amplifier unit, such that the drain current of this transistor is controlled by the voltage control signal. The first biasing current depends, in this embodiment, on the drain current. Preferably, the PMOS transistor of the first current source has also the same nominal dimensions, within the limits of fabrication, as the PMOS transistors of the current mirror load. In another embodiment, the dimensions of the PMOS transistor of the first current source are not nominally equal to those of the PMOS transistors of the current mirror load, but scaled by a proportionality factor.

In another embodiment, the first amplifying stage consists of a first long-tailed pair circuit. Additionally, or alternatively, in another embodiment, the second amplifying stage consist of a second long-tailed pair circuit with a current mirror load.

In another embodiment, the first differential amplifier unit, the second differential amplifier unit or both the first and the second differential amplifier units comprise a respective operational amplifier.

In a preferred embodiment, that may additionally include any of the technical features described with reference to any of the previous embodiments, the gain-control stage of the first aspect further comprises a bandgap-voltage reference unit, connected to the first and the second polarisation voltage supply lines and configured to generate and provide the reference voltage signal $V_{Ref}$ to the first input interface and to the second input interface.

In accordance with a second aspect of the invention, a variable gain amplifier is presented. The variable gain amplifier, also referred to herein as VGA, comprises a gain-control stage in accordance with any of the embodiments of the first aspect of the invention. The gain-control stage is advantageously configured to provide the first and the second gain-control signals, as described above. The VGA comprises a gain-control signal input configured to receive the first gain-control signal and the second gain-control signal from the gain-control stage. The VGA also comprises a variable-gain-amplifier signal input for receiving a first input signal In+ and a second input signal In−. The input signals are those signals that are subject to amplification in the VGA. The variable gain amplifier also comprises a variable-gain amplifying unit that is configured:

to receive the first and the second gain-control signal from the gain-control signal input;
to receive the first and the second input signal from the variable-gain-amplifier signal input; and
to amplify a difference of the input signals in accordance with a current value of the first and the second gain-control signal, thus generating a first output signal Out+ and a second output signal Out− with an amplified output signal difference.

The VGA further comprises a variable-gain-amplifier signal output for providing the first and the second output signal.

Thus, the first and the second gain-control signals provided by the gain-control stage are used to control a gain value of the variable-gain amplifying unit. The variable gain amplifier of the second aspect of the invention thus shares the advantages of the gain-control stage of the first aspect of the invention.

The gain-control stage and the variable-gain amplifying unit are connected to the first and the second voltage polarisation voltage supply lines.

In the following, embodiments of the variable gain amplifier of the second aspect of the invention will be described.

In a particular embodiment, the variable-gain amplifying unit comprises two cascode stages connected to the first and the second polarisation voltage supply lines. Each of the two cascode stages respectively include:

a first transistor connected to the variable-gain-amplifier signal output and to the gain control signal input for receiving the first gain-control signal $V_{c+}$;
a second transistor connected to the first transistor and to the variable-gain-amplifier signal input for receiving a respective one of the first input signal In+ and the second input signal.

The variable-gain amplifying unit also comprises a third transistor and a fourth transistor, both connected to the variable-gain-amplifier signal input for receiving the second gain-control signal $V_{c-}$, to the first polarisation voltage supply line, and to the first transistor and the second transistor of each of the two cascode stages.

In a preferred embodiment, the first transistors of the two cascode stages, the second transistors od the two cascode stages, the third transistor and the fourth transistor are bipolar transistors.

It shall be understood that the gain-control stage of claim 1 and the variable gain amplifier of claim 8, have similar and/or identical preferred embodiments, in particular, as defined in the dependent claims.

It shall be understood that a preferred embodiment of the present invention can also be any combination of the dependent claims or above embodiments with the respective independent claim.

BRIEF DESCRIPTION OF THE DRAWINGS

These and other aspects of the invention will be apparent from and elucidated with reference to the embodiments described hereinafter.

DETAILED DESCRIPTION

Figure 1:
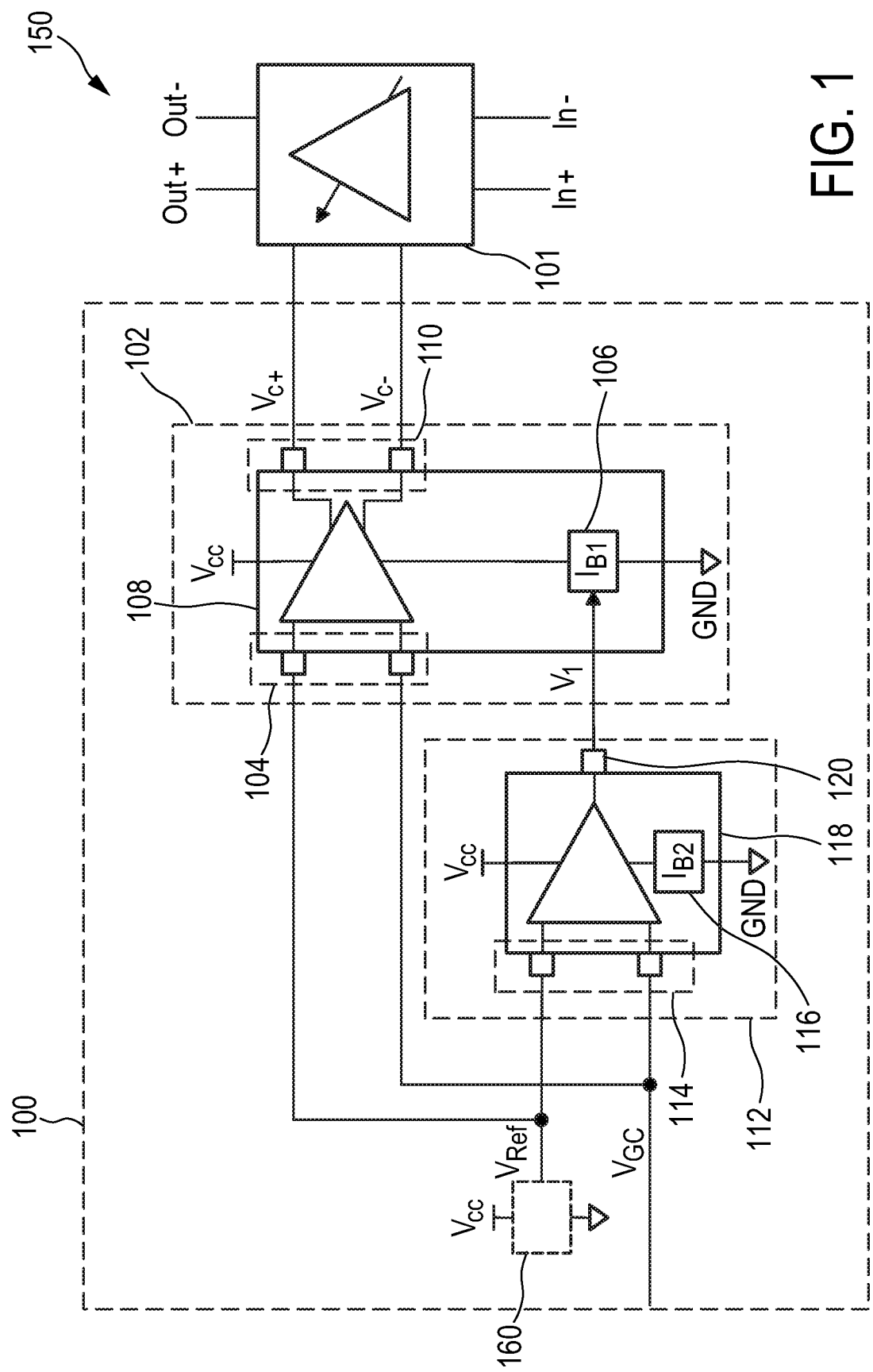
FIG. 1 shows a schematic block diagram of an embodiment of a variable gain amplifier having a gain control-stage.

FIG. 1 shows a schematic block diagram of an embodiment of a variable gain amplifier 105 having a gain-control stage 100 that is configured to control a gain value of a variable-gain amplifying unit 101. The gain-control stage comprises a first and a second differential amplifier unit, 102 and 112 respectively. The first differential amplifier unit 102 includes a first input interface 104, which is configured to receive a reference voltage signal $V_{Ref}$ and a variable gain-control voltage signal $V_{GC}$. The first differential amplifier unit 102 also includes a first amplifying stage 108 that comprises a controllable first current source 106. The first current source 106 is configured to provide a first biasing current $I_{B1}$ having a first biasing current amount that depends on a current voltage value of a control voltage signal $V_1$, which is generated and provided by the second differential amplifier unit 112. The first amplifying stage 108 is connected to a first polarisation voltage supply line that provides a first polarisation voltage $V_{CC}$. The first amplifying stage is also connected to a second polarisation voltage supply line GND for providing, via the first current source 116, a second polarisation voltage as a reference polarisation voltage. The first amplifying stage 108 is configured to receive, from the first input interface, the reference voltage signal $V_{ref}$ and the variable gain-control voltage signal $V_{GC}$ and to provide, via a first output interface 110, a first and a second gain-control signal, $V_{C+}, V_{C-}$, in dependence on the current values of the variable gain-control voltage signal $V_{GC}$ and the reference voltage signal $V_{ref}$.

The gain-control stage 100 also comprises the second differential amplifier unit 112, which is configured to provide the current voltage value of the control voltage signal $V_1$, to the first differential amplifier unit 102 for controlling the first biasing current amount $I_{B1}$. The second differential amplifier unit 112 comprises a second input interface 114 that is configured to receive the reference voltage signal $V_{Ref}$ and the control gain voltage signal $V_{GC}$. It also comprises a second amplifying stage 118 that includes a second current source 116, configured to provide a second biasing current $I_{B2}$ having a second biasing current amount. The second amplifying stage 118, as in the case of the first amplifying stage is connected to the first polarisation voltage supply line $V_{CC}$, to the second polarisation voltage supply line GND via the second current source 116, and to the second input interface, 114. The second amplifying stage 118 is configured to provide, via a second output interface 120, the current voltage value of the control voltage signal $V_1$ to the controllable first current source 106 of the first differential amplifier unit 102.

The second amplifying stage is connected to the first polarisation voltage supply line via an active-load unit. The active-load unit is an electrical unit acting as a circuit component that comprise active devices, and that acts as a current-stable non-linear resistor. The gain-control stage 100 may optionally comprise a bandgap-voltage reference unit 160 that is connected to the first and the second polarisation voltage supply lines and configured to generate and provide the reference voltage signal $V_{Ref}$ to the first input interface 104 and to the second input interface 114. The reference voltage signal provided by the bandgap-voltage reference unit has a constant value regardless of power supply variations (up to a predetermined maximum allowable deviation), temperature changes and circuit loading.

Figure 2:
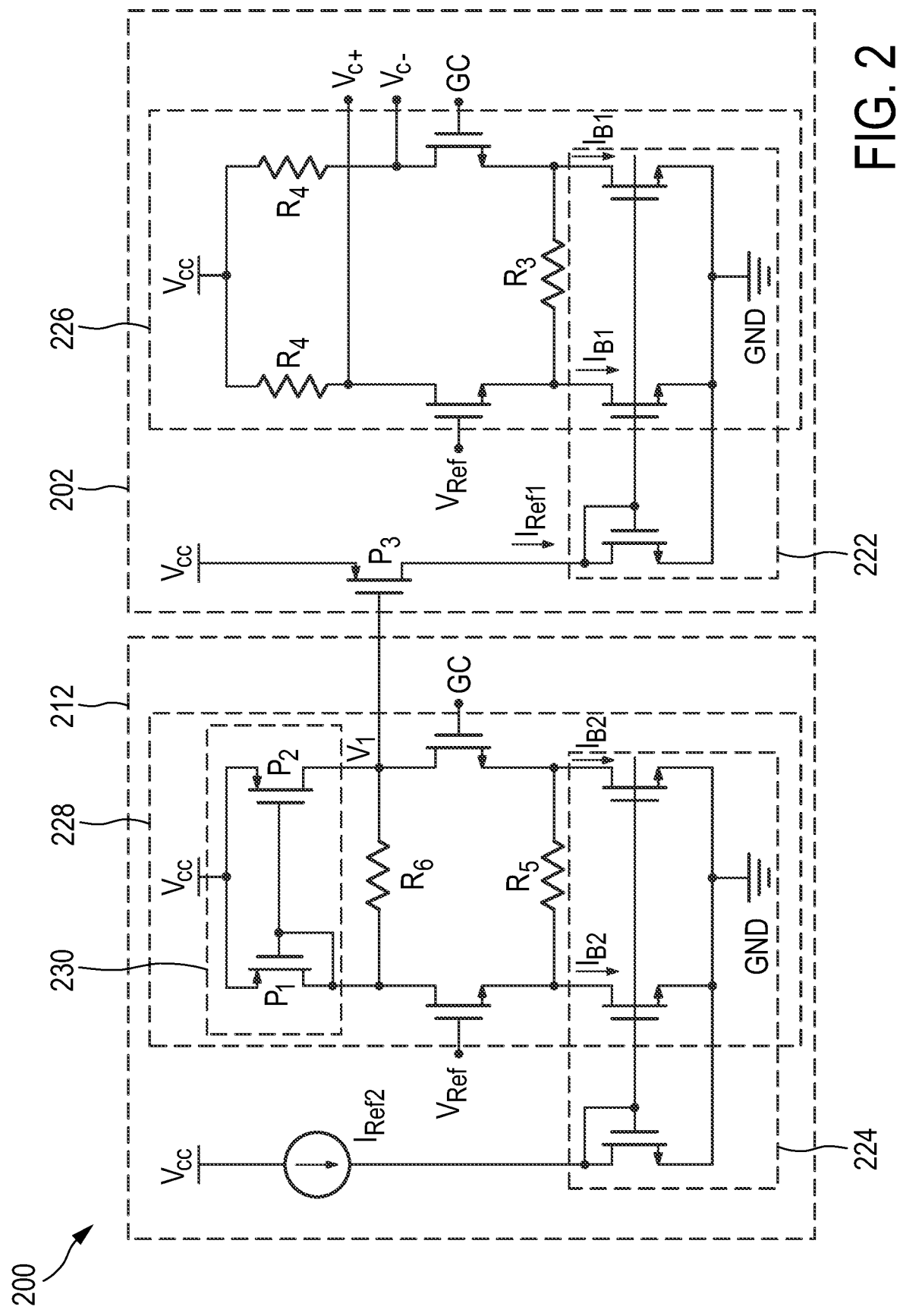
FIG. 2 shows an electrical circuit representing an embodiment of a gain-control stage.

FIG. 2 shows an electrical circuit representing an exemplary gain-control stage 200 for generating and providing the first and the second gain-control signals, $V_{C+}$ and $V_{C-}$, for controlling the gain value of a variable-gain amplifying unit (not shown). The gain-control stage includes the first differential amplifier unit 202 and the second differential amplifier unit 212 that is configured to provide the current voltage value of the control voltage signal $V_1$ to the first differential amplifier unit 202. The first and the second differential amplifier unit 202 and 212 comprise a respective input interface for receiving the reference voltage signal Vef and the variable gain-control voltage signal $V_{GC}$.

The first current source of the first amplifier unit 202 comprises a first current unit 222 that is configured to receive a reference current IRef1 and to provide the first biasing current $I_{B1}$ in dependence thereof. Respectively, the second current source of the second amplifier unit 212 comprises a second current unit 224 that is also configured to receive a reference current IRef2 and to provide the second biasing current $I_{B2}$ in dependence thereof. Exemplarily, the first and the second current units 222, 224 of the gain-control stage 200 are implemented as a current mirror source. Other gain-control stages comprise other types of suitable current unit such as, but not limited to, Wilson current sources. In another gain-control stage, the first and the second differential amplifier unit comprise different types of suitable current units. In the case of having perfectly matched transistors, the value of $I_{B1}$ and $I_{B2}$ mirror, i.e. matches, the value of the respective reference currents $I_{Ref1}$ and $I_{Ref2}$.

The first amplifying stage of the first differential amplifier unit 202 comprises a first long-tailed pair circuit 226. In general, a long tailed pair, also referred to as LTP or differential pair, operates as a differential amplifier configured to amplify a difference in voltage value of a pair of input signals $V_{Ref}$ and $V_{GC}$. A ratio of the resistance value of resistors R4 and R3 defines a gain value of the first differential amplifier unit 202. Additionally, the second amplifying stage of the second differential amplifier unit 212 comprises a second long-tailed pair circuit 228 with a current mirror load 230. As in the case of the first long tailed pair, the second long-tailed pair is also configured to amplify a difference in voltage value of a pair of input signals $V_{Ref}$ and $V_{GC}$. A ratio of the resistance value of resistors R6 and R5 defines a gain value of the second differential amplifier unit 212. The transistors P1 and P2 form the current mirror load. In the gain-control stage 200, the PMOS transistors P1, P2 are P3 are ideally matched and have the same dimensions. When the input signals $V_{Ref}$ and $V_{GC}$ are equal, the value of the current flowing through P3, i.e., $I_{Ref1}$, is equal to the current flowing through the diode-connected PMOS transistor P1. Thus, transistor P1 acts as a reference for P3. In another gain-control stage, the PMOS transistor P3 has scaled dimensions compared to those of P1 and P2, which are still matched. In this case, the value of the current $I_{Ref1}$ is proportional to that of the current flowing through P1, with a proportionality factor depending on a width and length extension value of the respective transistors P1 and P3.

When the input signals $V_{Ref}$ and $V_{GC}$ differ, the value of the current $I_{Ref1}$ will decrease or increase accordingly, which in turn changes the value of the first biasing current $I_{B1}$ of the first differential amplifier unit. In this way, when the value of $V_{GC}$ changes, the amount of current flowing through load resistors R4 also changes thus changing the value of the first and the second gain control signals, $V_{C+}$ and $V_{C-}$.

As $V_{CC}$ is the same supply voltage used for the first and the second differential amplifier units 102, 112, any fluctuation in the supply is directly affecting both the PMOS FETs in the first and second differential stages. This means that PMOS P1, P2 and P3 have their respective sources coupled to the same potential $V_{CC}$ and the reference $V_1$ is therefore usable even when $V_{CC}$ fluctuates. Preferably, the PMOS transistors have identical dimensions and are properly matched. Alternatively, NMOS transistors N1, N2 and N3 are used instead of the PMOS transistors P1, P2 and P3, in an exemplary gain-control stage (not shown). In this particular gain-control stage with NMOS transistors, they are all configured as current sources coupled to the ground. In general, the sources of the FETs P1, P2 and P3 must be referred to the same potential and have the same topology. In the case including NMOS transistors N1, N2 and N3, all other transistors are of the opposite topology as in FIG. 2, so for instance the transistors amplifying the signals $V_{Ref}$ and $V_{GC}$ in the differential pairs are PMOS transistors.

Figure 3:
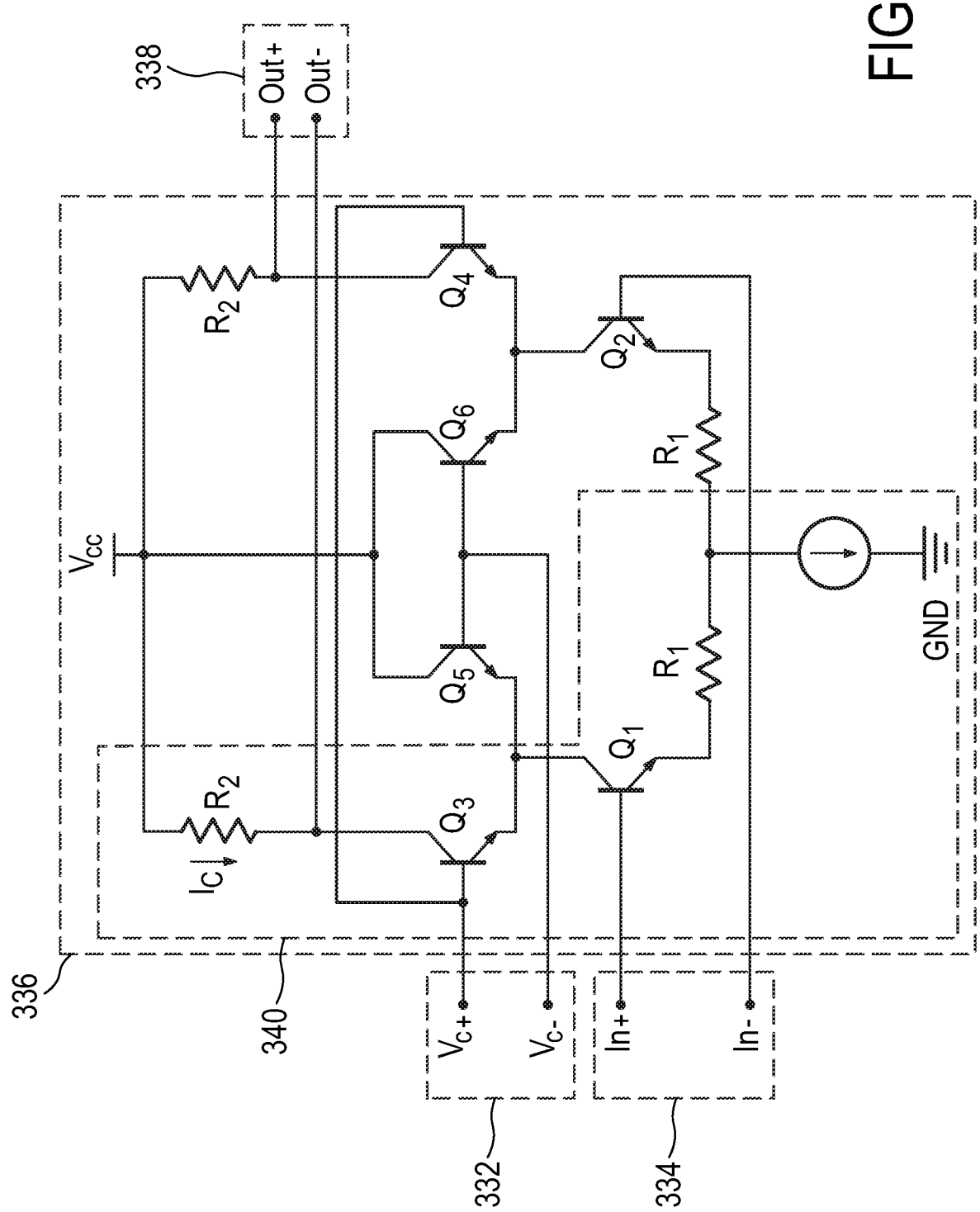
FIG. 3 shows an electrical circuit representing an embodiment of a variable-gain amplifying unit with a gain-control signal input, a variable-gain-amplifier signal input and a variable-gain-amplifier signal output.

FIG. 3 shows an electrical circuit representing a variable-gain amplifying unit 336 with a gain-control signal input 332, a variable-gain-amplifier signal input 334 and a variable-gain-amplifier signal output 338. The variable-gain amplifying unit 336 is configured to receive the first and the second gain control signals $V_{C+}$ and $V_{C-}$ from a gain-control stage (not shown) via the gain-control signal input 332. It is also configured to receive a first input signal In+ and a second input signal In− via the variable-gain-amplifier signal input 334. The variable-gain amplifying unit 336 is configured to amplify a difference of the input signals in accordance with a current value of the first and the second gain-control signal, thus generating a first output signal Out+ and a second output signal Out− with an amplified output signal difference. The variable-gain-amplifying unit also comprises a variable-gain-amplifier signal output 338 for providing the first and the second output signal.

In particular, the exemplary variable-gain-amplifying unit 336 comprises two cascode stages, such as cascode stage 340, connected to the first and the second polarisation voltage supply lines, $V_{CC}$ and GND. For the sake of clarity, the following explanation will refer to one of the two cascode stages. The second cascode stage includes the same number and type of active and passive devices. References to those devices and input or output signals of the second cascode stage that correspond to the devices referred to in the description of the first cascode stage 340 will be included in brackets.

The first cascode stage 340 comprises a first transistor Q3 (Q4) connected to the variable-gain-amplifier signal output 338 and to the gain control signal input 332 for receiving the first gain-control signal $V_{c+}$. It also comprises a second transistor Q1 (Q2) that is connected to the first transistor Q3 (Q4) and to the variable-gain-amplifier signal input 334 for receiving the first input signal In+(In−). The first transistor Q3 (Q4) is connected to the first polarisation voltage supply line via a resistor R2. The second transistor is connected to the second polarisation voltage supply line GND via a resistor R1 and a current source.

The variable-gain amplifying unit 336 also comprises a third transistor Q5 and a fourth transistor Q6, both connected to the variable-gain-amplifier signal input 332 for receiving the second gain-control signal Vc−, to the first polarisation voltage supply line, and to the first transistor Q3, Q4 and the second transistor Q1, Q2 of each of the two cascode stages.

The variable-gain amplifying unit 336 follows a topology commonly referred to as current-steering-based variable gain amplifier (VGA), which is based on a two-quadrant multiplier. It is based on cascode stages comprising a common-emitter amplifier that includes transistors Q1, Q2 and a common-base amplifier that includes transistors Q3, Q4. Resistors $R_1$ are so-called degeneration resistors and are connected to the emitter of Q1 and Q2. The resistors $R_2$ are collector resistors. In a cascode amplifier, the gain is approximated by the ratio $R_2/R_1$. Further, the product $R_2 \times I_C$ determines the potential difference that falls in the resistor $R_2$ and which defines the output common mode voltage $V_{CC}-(R_2 \times I_C)$. In addition to the standard cascode amplifier, transistors Q5 and Q6 are added, which turns the stage into a variable gain amplifier. Controlling the first and the second gain-control signals causes a variable amount of current through the transistors Q5 and Q6. This causes a change in the collector currents $I_C$, which modifies the gain of the VGA. In particular, when $I_C$ decreases, the gain decreases with minimal impact in other characteristics of the VGA such as for instance its bandwidth.

Based on the exemplary electrical circuits shown in FIGS. 2 and 3, the first and the second gain-control signals $V_{C+}$ and $V_{C-}$ affect the gain of the variable-gain amplifying unit in the following ways:

When $V_{GC}$ is lower than $V_{Ref}$ i.e. when the variable gain amplifier is in a low gain mode, the voltage value of the control voltage signal $V_1$ is higher than when $V_{GC}$ is equal to $V_{Ref}$. This is based on the fact that the transistor P3 is a PMOS transistor, so a lower gate-to-source voltage $V_{GS}$ causes a lower drain-source current $I_{DS}$, which is referred to as $I_{Ref1}$ in FIG. 2. Thus, the current amount $I_{Ref1}$ decreases. Also, a common mode of the first and second gain-control signals increases. The increase in this common mode compensates how much the collector-emitter voltage $V_{CE}$ of the transistors Q3 and Q4 increases thus ensuring that a breakdown voltage value is not exceeded.

In turn, when $V_{GC}$ is higher than $V_{Ref}$ i.e. when the variable gain amplifier is in a high gain mode, the voltage value of the control voltage signal is lower than when $V_{GC}$ is equal to $V_{Ref}$. Thus, the current amount $I_{Ref1}$ increases. Also, the common mode of the first and second gain-control signals decreases. The decrease of in this common mode compensates how much the saturation collector-emitter voltage $V_{CE}$ of the transistors Q3 and Q4 decreases thus ensuring that a saturation collector-emitter voltage value $V_{CE,sat}$ is not reached.

The gain-control Signals provided by the claimed gain-control stage are differential Signals (Vc+ and Ve−). As known in the literature, differentials Signals are more immune to ground noise and supply fluctuations, as the information is carried by the difference between the Signals without any dependency to the supply or ground. Therefore, the conversion of the control signal VGC to a differential signal is inherent in the invention from the very beginning in all the stages presented. Moreover, the first differential pair as it is based on an NMOS amplifier, the common mode of the Output differential Signals Vc+ and Ve− is dependent on the supply Vcc. This means, if there are Vcc fluctuations, they tend to influence equally the Output common-mode voltages of the VGA and the first differential pair, so in the VGA the controlled difference between collector and base voltages of the transistors Q3 to Q6 remain the same. This means, any fluctuation in the supply will not affect the purpose of this invention, which is to provide a control Signal to the VGA that will not force the bipolar transistors to be out of the proper operating range.

Thus, the variable gain amplifier 150 comprising the gain-control stage 100 or 200 and the variable-gain amplifying unit 336 is suitable for solving an essential drawback of steering-current-based variable gain amplifiers. The first and the second gain-control signals keep the bipolar transistors of the variable-gain amplifying unit 336 in a linear region, avoiding that VCE exceeds the breakdown voltage amount or reaches saturation collector-emitter voltage value $V_{CE,sat}$. Additionally, the variable gain amplifier 150 provides compensation against supply voltage fluctuations. The feedforward architecture further opens the possibility to be used in any multi-stage transimpedance amplifier with input overload-current compensation or DC-offset cancellation loop or both.

In summary, the invention relates to a gain-control stage for generating gain-control signals for controlling an external variable-gain amplifying unit. The gain-control stage comprises a first and a second differential amplifier unit, that receive, at a respective input interface, a reference voltage signal and a variable gain-control voltage signal. The second differential amplifier unit is configured to provide, via a second output interface, a control voltage signal to a controllable first current source of the first differential amplifier unit. The first differential amplifier unit is configured to provide, via a first output interface, the first and the second gain-control signal in dependence on the variable gain-control voltage signal, the reference voltage signal and a first biasing current that depends on the control voltage signal.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfil the functions of several items recited in the claims. The mere fact that certain measures are recited in mutually different dependent claims does not indicate that a combination of these measures cannot be used to advantage.

Any reference signs in the claims should not be construed as limiting the scope.

What is claimed is:

1. A gain-control stage for generating a first gain-control signal ($V_{c+}$) and a second gain-control signal ($V_{c-}$) for controlling a gain value of an external variable-gain amplifying unit, the gain-control stage comprising:
    a first differential amplifier unit, comprising:
        a first input interface configured to receive a reference voltage signal ($V_{Ref}$) and a variable gain-control voltage signal ($V_{GC}$);
        a first amplifying stage comprising a controllable first current source, configured to provide a first biasing current ($I_{B1}$) having a first biasing current amount that depends on a current voltage value of a control voltage signal ($V_1$), the first amplifying stage being connected to a first polarization voltage supply line for providing a first polarization voltage ($V_{cc}$) to a second polarization voltage supply line (GND) for providing, via the first current source, a second polarization voltage as a reference polarization voltage, and to the first input interface, the first amplifying stage being configured to provide, via a first output interface, the first and the second gain-control signals ($V_{c+}$, $V_{c-}$) in dependence on the variable gain-control voltage signal, the reference voltage signal and the first biasing current ($I_{B1}$); and
    a second differential amplifier unit for providing the current voltage value of the control voltage signal, comprising:
        a second input interface configured to receive the reference voltage signal ($V_{Ref}$) and the variable gain-control voltage signal ($V_{GC}$);
        a second amplifying stage comprising a second current source, configured to provide a second biasing current ($I_{B2}$) having a second biasing current amount, the second amplifying stage being connected to the first polarization voltage supply line via an active load unit, to the second polarization voltage supply line via the second current source, and to the second input interface, the second amplifying stage being configured to provide, via a second output interface, the current voltage value of the control voltage signal ($V_1$) to the controllable first current source of the first differential amplifier unit,
        wherein the second amplifying stage of the second differential amplifier unit comprises a second long-tailed pair circuit with a current mirror load as the active load unit.

2. The gain-control stage of claim 1, wherein the controllable first current source, or the second current source or both the first and the second current source comprises a respective first and second current unit configured to receive a respective reference current ($I_{Ref1}$, $I_{Ref2}$) and to provide the respective first biasing current ($I_{B1}$) or second biasing current ($I_{B2}$) in dependence on the respective reference current.

3. The gain-control stage of claim 2, wherein the first current unit and/or the second current unit is current mirror source or a Wilson current source.

4. The gain-control stage of claim 3, wherein the first amplifying stage of the first differential amplifier unit comprises a first long-tailed pair circuit.

5. The gain-control stage of claim 4, further comprising a bandgap-voltage reference unit connected to the first and the second polarization voltage supply lines and configured to generate and provide the reference voltage signal ($V_{Ref}$) to the first input interface and to the second input interface.

6. A variable gain amplifier, comprising:
    a gain-control stage in accordance with claim 1 for providing the first and the second gain-control signals;
    a gain-control signal input for receiving the first gain-control signal ($V_{c+}$) and the second gain-control signal ($V_{c-}$);
    a variable-gain-amplifier signal input for receiving a first input signal (In+) and a second input signal (In−);
    a variable-gain amplifying unit configured:
        to receive the first and the second gain-control signals from the gain-control signal input;
        to receive the first and the second input signals from the variable-gain-amplifier signal input;

to amplify a difference of the first and the second input signals in accordance with a current value of the first and the second gain-control signals, thus generating a first output signal (Out+) and a second output signal (Out−) with an amplified output signal difference; and a variable-gain-amplifier signal output for providing the first and the second output signals.

7. The variable gain amplifier of claim 6, wherein the variable-gain amplifying unit comprises:

two cascode stages connected to the first and the second polarization voltage supply lines, each cascode stage comprising:

a first transistor (Q3) connected to the variable-gain-amplifier signal output, and to the gain control signal input for receiving the first gain-control signal ($V_{c+}$);

a second transistor (Q1) connected to the first transistor (Q3) and to the variable-gain-amplifier signal input for receiving a respective one of the first input signal (In+) and the second input signal;

a third transistor (Q5) and a fourth transistor (Q6), both connected to the variable-gain-amplifier signal input for receiving the second gain-control signal ($V_{c−}$), to the first polarization voltage supply line, and to the first transistor (Q3) and the second transistor (Q1) of each of the two cascode stages.

8. The variable gain amplifier of claim 7, wherein the first transistors (Q3, Q4), the second transistors (Q1, Q2), the third transistor (Q5) and the fourth transistor (Q6) are bipolar transistors.

9. The gain-control stage of claim 1, wherein the first amplifying stage of the first differential amplifier unit comprises a first long-tailed pair circuit.

10. The gain-control stage of claim 2, wherein the first amplifying stage of the first differential amplifier unit comprises a first long-tailed pair circuit.

11. The gain-control stage of the claim 4, wherein the first long-tailed pair circuit or the first long-tailed pair circuit and the second long-tailed pair circuit with the current mirror load comprise field effect transistors (P1, P2).

12. The gain-control stage of claim 1, further comprising a bandgap-voltage reference unit connected to the first and the second polarization voltage supply lines and configured to generate and provide the reference voltage signal ($V_{Ref}$) to the first input interface and to the second input interface.

* * * * *